US012271595B2

(12) United States Patent
Lazovsky et al.

(10) Patent No.: US 12,271,595 B2
(45) Date of Patent: Apr. 8, 2025

(54) PHOTONIC MEMORY FABRIC FOR SYSTEM MEMORY INTERCONNECTION

(71) Applicant: Celestial AI Inc., Santa Clara, CA (US)

(72) Inventors: David Lazovsky, Los Gatos, CA (US); Philip Winterbottom, San Jose, CA (US); Martinus Bos, San Jose, CA (US)

(73) Assignee: Celestial AI Inc., Santa Clara, CA (US)

( * ) Notice: Subject to any disclaimer, the term of this patent is extended or adjusted under 35 U.S.C. 154(b) by 141 days.

(21) Appl. No.: 17/903,455

(22) Filed: Sep. 6, 2022

(65) Prior Publication Data

US 2023/0297237 A1    Sep. 21, 2023

Related U.S. Application Data

(60) Provisional application No. 63/321,453, filed on Mar. 18, 2022.

(51) Int. Cl.
*H04Q 11/00* (2006.01)
*G02B 6/12* (2006.01)
(Continued)

(52) U.S. Cl.
CPC ........ *G06F 3/0611* (2013.01); *G02B 6/12019* (2013.01); *G02B 6/1225* (2013.01); *G02B 6/4246* (2013.01); *G06F 3/0655* (2013.01); *G06F 3/0679* (2013.01); *H04Q 11/0062* (2013.01)

(58) Field of Classification Search
CPC .................................................. H04Q 11/0062
See application file for complete search history.

(56) References Cited

U.S. PATENT DOCUMENTS

| 4,912,706 A | 3/1990 | Eisenberg et al. |
| 4,934,775 A | 6/1990 | Koai |

(Continued)

FOREIGN PATENT DOCUMENTS

| AU | 2019100030 A | 2/2019 |
| AU | 2019100679 A | 8/2019 |

(Continued)

OTHER PUBLICATIONS

G. Hendry et al., "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12. (Year: 2010).*

(Continued)

*Primary Examiner* — Nathan M Cors
(74) *Attorney, Agent, or Firm* — Ray Quinney & Nebeker; James Bullough (57) ABSTRACT

One embodiment is a method that includes generating a request for a data item in a memory, obtaining the data item from the memory with a photonic interface, sending the data item to a fabric using a transmit unit of the photonic interface, and routing the data item through a portion of the fabric coupled to the memory, the portion of the fabric including one or more additional transmit and receive units between the photonic interface and a destination receive unit.

24 Claims, 10 Drawing Sheets

(51) Int. Cl.
    *G02B 6/122*     (2006.01)
    *G02B 6/42*     (2006.01)
    *G06F 3/06*     (2006.01)

(56) References Cited

U.S. PATENT DOCUMENTS

| | | | |
|---|---|---|---|
| 5,457,563 A | 10/1995 | Van Deventer | |
| 6,249,621 B1 | 6/2001 | Sargent et al. | |
| 6,714,552 B1 | 3/2004 | Cotter | |
| 7,034,641 B1 | 4/2006 | Clarke et al. | |
| 7,778,501 B2 | 8/2010 | Beausoleil et al. | |
| 7,889,996 B2 | 2/2011 | Zheng et al. | |
| 7,894,699 B2 | 2/2011 | Beausoleil | |
| 7,961,990 B2 | 6/2011 | Krishnamoorthy et al. | |
| 8,064,739 B2 | 11/2011 | Binkert et al. | |
| 8,213,751 B1 | 7/2012 | Ho et al. | |
| 8,260,147 B2 | 9/2012 | Scandurra et al. | |
| 8,285,140 B2 | 10/2012 | McCracken et al. | |
| 8,326,148 B2 | 12/2012 | Bergman et al. | |
| 8,340,517 B2 | 12/2012 | Shacham et al. | |
| 8,447,146 B2 | 5/2013 | Beausoleil et al. | |
| 8,611,747 B1 | 12/2013 | Wach | |
| 9,036,482 B2 | 5/2015 | Lea | |
| 9,369,784 B2 | 6/2016 | Zid et al. | |
| 9,495,295 B1 | 11/2016 | Dutt et al. | |
| 9,791,761 B1 | 9/2017 | Li et al. | |
| 9,831,360 B2 | 11/2017 | Knights et al. | |
| 9,882,655 B2 | 1/2018 | Li et al. | |
| 10,031,287 B1 | 7/2018 | Heroux et al. | |
| 10,107,959 B2 | 10/2018 | Heroux et al. | |
| 10,117,007 B2 | 10/2018 | Song et al. | |
| 10,185,085 B2 | 1/2019 | Huangfu et al. | |
| 10,225,632 B1 | 3/2019 | Dupuis et al. | |
| 10,250,958 B2 | 4/2019 | Chen et al. | |
| 10,281,747 B2 | 5/2019 | Padmaraju et al. | |
| 10,365,445 B2 | 7/2019 | Badihi et al. | |
| 10,564,512 B2 | 2/2020 | Sun et al. | |
| 10,598,852 B1 | 3/2020 | Zhao et al. | |
| 10,651,933 B1 | 5/2020 | Chiang et al. | |
| 10,837,827 B2 | 11/2020 | Nahmias et al. | |
| 10,908,369 B1 | 2/2021 | Mahdi et al. | |
| 10,915,297 B1 | 2/2021 | Halutz et al. | |
| 10,935,722 B1 | 3/2021 | Li et al. | |
| 10,951,325 B1 | 3/2021 | Rathinasamy et al. | |
| 10,962,728 B1 | 3/2021 | Nelson et al. | |
| 10,976,491 B2 | 4/2021 | Coolbaugh et al. | |
| 11,107,770 B1 | 8/2021 | Ramalingam et al. | |
| 11,165,509 B1 | 11/2021 | Nagarajan et al. | |
| 11,165,711 B2 | 11/2021 | Mehrvar et al. | |
| 11,233,580 B2 | 1/2022 | Meade et al. | |
| 11,321,092 B1 | 5/2022 | Raikin et al. | |
| 11,336,376 B1 | 5/2022 | Xie | |
| 11,493,714 B1 | 11/2022 | Mendoza et al. | |
| 11,500,153 B2 | 11/2022 | Meade et al. | |
| 11,769,710 B2 | 9/2023 | Refai-Ahmed et al. | |
| 2004/0213229 A1 | 10/2004 | Chang et al. | |
| 2006/0159387 A1 | 7/2006 | Handelman | |
| 2006/0204247 A1 | 9/2006 | Murphy | |
| 2011/0206379 A1 | 8/2011 | Budd | |
| 2012/0020663 A1* | 1/2012 | McLaren | G02B 6/2852 398/48 |
| 2012/0251116 A1 | 10/2012 | Li et al. | |
| 2013/0275703 A1* | 10/2013 | Schenfeld | G06F 3/0631 711/E12.002 |
| 2013/0308942 A1* | 11/2013 | Ji | H04B 10/801 398/68 |
| 2015/0109024 A1 | 4/2015 | Abdelfattah et al. | |
| 2015/0354938 A1 | 12/2015 | Mower et al. | |
| 2016/0116688 A1* | 4/2016 | Hochberg | G02B 6/4232 385/14 |
| 2016/0131862 A1 | 5/2016 | Rickman et al. | |
| 2016/0344507 A1 | 11/2016 | Marquardt et al. | |
| 2017/0045697 A1 | 2/2017 | Hochberg et al. | |
| 2017/0194309 A1 | 7/2017 | Evans et al. | |
| 2017/0194310 A1 | 7/2017 | Evans et al. | |
| 2017/0207600 A1 | 7/2017 | Klamkin et al. | |
| 2017/0220352 A1 | 8/2017 | Woo et al. | |
| 2017/0261708 A1 | 9/2017 | Ding et al. | |
| 2017/0285372 A1 | 10/2017 | Baba et al. | |
| 2018/0107030 A1 | 4/2018 | Morton et al. | |
| 2018/0260703 A1 | 9/2018 | Soljacic et al. | |
| 2019/0026225 A1 | 1/2019 | Gu et al. | |
| 2019/0049665 A1 | 2/2019 | Ma et al. | |
| 2019/0205737 A1 | 7/2019 | Bleiweiss et al. | |
| 2019/0265408 A1 | 8/2019 | Ji et al. | |
| 2019/0266088 A1 | 8/2019 | Kumar | |
| 2019/0266089 A1 | 8/2019 | Kumar | |
| 2019/0294199 A1 | 9/2019 | Carolan et al. | |
| 2019/0317285 A1 | 10/2019 | Liff | |
| 2019/0317287 A1 | 10/2019 | Raghunathan et al. | |
| 2019/0356394 A1 | 11/2019 | Bunandar et al. | |
| 2019/0372589 A1 | 12/2019 | Gould | |
| 2019/0385997 A1 | 12/2019 | Choi et al. | |
| 2020/0006304 A1 | 1/2020 | Chang et al. | |
| 2020/0125716 A1 | 4/2020 | Chittamuru et al. | |
| 2020/0142441 A1 | 5/2020 | Bunandar et al. | |
| 2020/0158967 A1 | 5/2020 | Winzer et al. | |
| 2020/0174707 A1 | 6/2020 | Johnson et al. | |
| 2020/0200987 A1 | 6/2020 | Kim | |
| 2020/0213028 A1 | 7/2020 | Behringer et al. | |
| 2020/0250532 A1 | 8/2020 | Shen et al. | |
| 2020/0284981 A1 | 9/2020 | Harris et al. | |
| 2020/0310761 A1 | 10/2020 | Rossi et al. | |
| 2020/0409001 A1 | 12/2020 | Liang et al. | |
| 2020/0410330 A1 | 12/2020 | Liu et al. | |
| 2021/0036783 A1 | 2/2021 | Bunandar et al. | |
| 2021/0064958 A1 | 3/2021 | Lin et al. | |
| 2021/0072784 A1 | 3/2021 | Lin et al. | |
| 2021/0116637 A1 | 4/2021 | Li et al. | |
| 2021/0132309 A1 | 5/2021 | Zhang et al. | |
| 2021/0132650 A1 | 5/2021 | Wenhua et al. | |
| 2021/0133547 A1 | 5/2021 | Wenhua et al. | |
| 2021/0173238 A1 | 6/2021 | Hosseinzadeh | |
| 2021/0257396 A1 | 8/2021 | Piggott et al. | |
| 2021/0271020 A1 | 9/2021 | Islam et al. | |
| 2021/0286129 A1 | 9/2021 | Fini et al. | |
| 2021/0305127 A1 | 9/2021 | Refai-Ahmed et al. | |
| 2021/0406164 A1 | 12/2021 | Grymel et al. | |
| 2021/0409848 A1* | 12/2021 | Saunders | H04B 10/40 |
| 2022/0003948 A1 | 1/2022 | Zhou et al. | |
| 2022/0004029 A1 | 1/2022 | Meng | |
| 2022/0012578 A1 | 1/2022 | Brady et al. | |
| 2022/0012582 A1 | 1/2022 | Pleros et al. | |
| 2022/0044092 A1 | 2/2022 | Pleros et al. | |
| 2022/0045757 A1 | 2/2022 | Pleros et al. | |
| 2022/0091332 A1 | 3/2022 | Yoo et al. | |
| 2022/0092016 A1* | 3/2022 | Kumashikar | G06F 13/4068 |
| 2022/0159860 A1 | 5/2022 | Winzer et al. | |
| 2022/0171142 A1 | 6/2022 | Wright et al. | |
| 2022/0263582 A1 | 8/2022 | Ma et al. | |
| 2022/0302033 A1 | 9/2022 | Cheah et al. | |
| 2022/0342164 A1 | 10/2022 | Chen et al. | |
| 2022/0374575 A1 | 11/2022 | Ramey et al. | |
| 2022/0382005 A1 | 12/2022 | Rusu | |
| 2023/0089415 A1 | 3/2023 | Zilkie et al. | |
| 2023/0197699 A1 | 6/2023 | Spreitzer et al. | |
| 2023/0251423 A1 | 8/2023 | Perez Lopez et al. | |
| 2023/0258886 A1 | 8/2023 | Liao | |
| 2023/0282547 A1 | 9/2023 | Refai-Ahmed et al. | |
| 2023/0308188 A1 | 9/2023 | Dorta-Quinones | |
| 2023/0314702 A1 | 10/2023 | Yu | |
| 2023/0376818 A1 | 11/2023 | Nowak | |
| 2023/0393357 A1 | 12/2023 | Ranno | |

FOREIGN PATENT DOCUMENTS

| | | |
|---|---|---|
| AU | 2019100750 A | 8/2019 |
| CN | 102281478 A | 12/2011 |
| CN | 102333250 A | 1/2012 |
| CN | 102413039 A | 4/2012 |
| CN | 102638311 A | 8/2012 |
| CN | 102645706 A | 8/2012 |
| CN | 202522621 U | 11/2012 |
| CN | 103369415 A | 10/2013 |

(56) References Cited

FOREIGN PATENT DOCUMENTS

| | | |
|---|---|---|
| CN | 103442311 A | 12/2013 |
| CN | 103580890 A | 2/2014 |
| CN | 104539547 A | 4/2015 |
| CN | 105451103 A | 3/2016 |
| CN | 205354341 U | 6/2016 |
| CN | 105812063 A | 7/2016 |
| CN | 105847166 A | 8/2016 |
| CN | 106126471 A | 11/2016 |
| CN | 106331909 A | 1/2017 |
| CN | 106407154 A | 2/2017 |
| CN | 106533993 A | 3/2017 |
| CN | 106549874 A | 3/2017 |
| CN | 106796324 | 5/2017 |
| CN | 106888050 A | 6/2017 |
| CN | 106911521 A | 6/2017 |
| CN | 106936708 A | 7/2017 |
| CN | 106936736 A | 7/2017 |
| CN | 106980160 A | 7/2017 |
| CN | 107911761 A | 4/2018 |
| CN | 108599850 A | 9/2018 |
| CN | 207835452 U | 9/2018 |
| CN | 108737011 A | 11/2018 |
| CN | 110266585 A | 9/2019 |
| CN | 110505021 A | 11/2019 |
| CN | 111208690 A | 5/2020 |
| CN | 111752891 A | 10/2020 |
| CN | 111770019 A | 10/2020 |
| CN | 111786911 A | 10/2020 |
| FR | 3007537 A | 12/2014 |
| GB | 2223867 | 4/1990 |
| IN | 201621017235 A | 7/2016 |
| IN | 202121008267 A | 4/2021 |
| JP | 6747660 B | 8/2020 |
| JP | 2020155112 | 9/2020 |
| KR | 101242172 B | 3/2013 |
| KR | 101382606 B | 4/2014 |
| KR | 101465420 B | 11/2014 |
| KR | 101465498 B | 11/2014 |
| KR | 101541534 B | 8/2015 |
| KR | 101548695 B | 9/2015 |
| KR | 101766786 B | 8/2017 |
| KR | 101766792 B | 8/2017 |
| WO | WO2015176289 | 11/2015 |
| WO | WO2020072925 | 4/2020 |
| WO | WO2020102204 | 5/2020 |
| WO | WO2020191217 | 9/2020 |
| WO | WO2021021787 | 2/2021 |
| WO | WO2022032105 | 2/2022 |
| WO | WO2022133490 | 6/2022 |
| WO | WO2023177417 | 9/2022 |
| WO | WO2022266676 | 12/2022 |
| WO | WO2023177922 | 9/2023 |

OTHER PUBLICATIONS

U.S. Appl. No. 18/293,673, filed Jan. 30, 2024, Bos et al.
U.S. Appl. No. 18/407,408, filed Jan. 8, 2024, Aggarwal.
U.S. Appl. No. 18/407,410, filed Jan. 8, 2024, Aggarwal.
U.S. Appl. No. 18/423,210, filed Jan. 25, 2024, Winterbottom.
U.S. Appl. No. 18/540,579, filed Dec. 14, 2023, Winterbottom et al.
U.S. Appl. No. 18/590,689, filed Feb. 28, 2024, Winterbottom et al.
U.S. Appl. No. 18/590,703, filed Feb. 28, 2024, Winterbottom et al.
U.S. Appl. No. 18/590,708, filed Feb. 28, 2024, Winterbottom et al.
U.S. Appl. No. 18/540,579, filed Feb. 14, 2024, Office Action.
U.S. Appl. No. 17/807,692, filed Feb. 15, 2024, Restricition Requirement.
U.S. Appl. No. 18/407,408, filed Mar. 28, 2024, Office Action.
U.S. Appl. No. 18/407,410, filed Mar. 15, 2024, Restriciton Requirement.
20220404544, Jan. 19, 2024, Foreign Office Action.
202180068303.5, Jan. 20, 2024, Foreign Office Action.
PCT/US2022/042621, Feb. 26, 2024, International Preliminary Report on Patentability.
U.S. Appl. No. 18/123,161, filed Mar. 17, 2023, Bos et al.
U.S. Appl. No. 18/123,170, filed Mar. 17, 2023, Sahni.
U.S. Appl. No. 63/428,663, filed Nov. 29, 2022, Sahni et al.
U.S. Appl. No. 63/441,689, filed Jan. 27, 2023, Winterbottom.
U.S. Appl. No. 63/579,486, filed Aug. 29, 2023, Aggarwal et al.
U.S. Appl. No. 63/535,509, filed Aug. 30, 2023, Winterbottom et al.
U.S. Appl. No. 63/535,511, filed Aug. 30, 2023, Winterbottom et al.
U.S. Appl. No. 63/535,512, filed Aug. 30, 2023, José Maia da Silva et al.
U.S. Appl. No. 63/592,509, filed Oct. 23, 2023, Aggarwal et al.
U.S. Appl. No. 63/592,517, filed Oct. 23, 2023, Winterbottom et al.
U.S. Appl. No. 18/473,898, filed Sep. 25, 2023, Pleros et al.
U.S. Appl. No. 18/523,667, filed Nov. 29, 2023, Sahni et al.
Raj, Mayank et al.; "Design of a 50-GB/s Hybid Integrated Si-Photonic Optical Link in 16-nm FinFET"; IEEE Journal of Solid-State Circuits, vol. 55, No. 4, Apr. 2020, pp. 1086-1095.
U.S. Appl. No. 17/395,849, filed Jan. 5, 2023, Office Action.
U.S. Appl. No. 17/395,849, filed Jul. 24, 2023, Notice of Allowance.
U.S. Appl. No. 17/645,001, filed Jul. 20, 2022, Notice of Allowance.
PCT/US2022/042621, Feb. 15, 2023, International Search Report and Written Opinion.
PCT/US2023/015680, May 23, 2023, Invitation to Pay Additional Fees.
PCT/US2023/0015680, Aug. 23, 2023, International Search Report and Written Opinion.
U.S. Appl. No. 63/049,928, filed Jul. 9, 2020, Pleros et al.
U.S. Appl. No. 63/062,163, filed Aug. 6, 2020, Pleros et al.
U.S. Appl. No. 63/199,286, filed Dec. 17, 2020, Ma et al.
U.S. Appl. No. 63/199,412, filed Dec. 23, 2022, Ma et al.
U.S. Appl. No. 63/201,155, filed Apr. 15, 2021, Ma et al.
U.S. Appl. No. 63/261,974, filed Oct. 1, 2021, Pleros et al.
U.S. Appl. No. 63/212,353, filed Jun. 18, 2021, Winterbottom et al.
U.S. Appl. No. 17/807,692, filed Jun. 17, 2022, Winterbottom et al.
PCT/US2022/073039, Jun. 17, 2022, Winterbottom et al.
U.S. Appl. No. 17/807,694, filed Jun. 17, 2022, Winterbottom et al.
U.S. Appl. No. 17/807,698, filed Jun. 17, 2022, Winterbottom et al.
U.S. Appl. No. 17/807,699, filed Jun. 17, 2022, Winterbottom et al.
U.S. Appl. No. 17/807,695, filed Jun. 17, 2022, Winterbottom et al.
U.S. Appl. No. 63/321,453, filed Mar. 18, 2022, Bos et al.
PCT/US2022/042621, Sep. 6, 2022, Lazovsky et al.
U.S. Appl. No. 17/957,731, filed Sep. 30, 2022, Pleros et al.
U.S. Appl. No. 17/957,812, filed Sep. 30, 2022, Pleros et al.
U.S. Appl. No. 63/420,323, filed Oct. 28, 2022, Sahni.
U.S. Appl. No. 63/420,330, filed Oct. 28, 2022, Sahni et al.
Ardestani, et al., "Supporting Massive DLRM Inference Through Software Defined Memory", Nov. 8, 2021; 14 pages.
Agrawal, Govind; "Chapter 4—Optical Receivers", Fiber-Optic Communications Systems, John Wiley & Sons, Inc., (2002), pp. 133-182.
Burgwal, Roel et al; "Using an imperfect photonic network to implement random unitaries," Opt. Express 25(23), (2017), 28236-28245.
Capmany, Francoy et al.; "Thepgrammable processor" Nature Photonics, 109/22/20226, (2016), 5 pgs.
Carolan, Jacques et al.; "Universal Linear Optics"; arXiv: 1505.01182v1; (2015); 13 pgs.
Clements, William et al; "Optimal design for universal multiport interferometers"; Optica; vol. 3, No. 12; (2016), pp. 1460-1465.
Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.
Eltes, Felix et al.; Low-Loss BaTiO3—Si Waveguides for Nonlinear Integrated Photonics; ACS Photon., vol. 3, No. 9; (2016), pp. 1698-1703.
Harris, NC et al.; "Efficient, compact and low loss thermo-optic phase shifter in colicon"; Opt. Express, vol. 22, No. 9; (2014), pp. 10487-10493.
Jiang, W.; "Nonvolatile and ultra-low-loss reconfigurable mode (De) multiplexer/switch using triple-waveguide coupler with Ge2Sb2Se4T31 phase change material"; Sci. Rep. vol. 8, No. 1; (2018), 12 pages.

(56) References Cited

OTHER PUBLICATIONS

Lambrecht, Joris et al.; "90-GB/s NRZ Optical Receiveer in Silicon Using a Fully Differential Transimpedance Aplifier," Journal of Lightwave Technology, vol. 37, No. 9; (2019); pp. 1964-1973.
Manolis, A. et al; "Non-volatile integrated photonic memory using GST phase change material on a fully eched Si3N4/SiO2 waveguide"; Conference on Lasers and Electro-optics; OSA Technical Digest, paper STh3R.4; (2020); 2 pages.
Miller, David A. et al; "Perfect optics with imperfect components"; Optica, vol. 2, No. 8; (2015); pp. 747-750.
Miller, David A. et al; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.
Miscuglio, Mario et al.; "Photonic Tensor cores for machine learning"; Applied Physics Reviews, vol. 7, Issue 3; (2020), 16 pages.
Mourgias-Alexandris, George et al; "An all-optical neuron with sigmoid activation function;" Optics Express, vol. 27, No. 7; (2019), pp. 9620-9630.
Mourgias-Alexandris, George et al; Neuromorphic Photonics with Coherent Linear Neurons Using Dual-IQ Modulation Cells, Journal of Lightwave Technology, vol. 38, No. 4; Feb. 15, 2020, pp. 811-819.
Pai, Sunil et al.; "Parallel Programming of an Arbitrary Feedforward Photonic Network"; IEEE Journal of Selected Topics in Quantum Electronics, vol. 26, No. 5; (2020), 13 pages.
Perez, Daniel et al. "Reconfigurable lattice mesh designs for prgrammable photonic processors"; Optics Express vol. 24, Issue 11; (2016); pp. 12093-12106.
Reck, M. et al; "Experimental Realization of any Discrete Unitary Operator"; Phys. Rev. Lett. 73; (1994); pp. 58-61.
Shen, Yichen et al; "Deep learning with coherent nanophotonic circuits"; https://arxiv.org/pdf/1610.02365.pdf; (2016); 8 pages.
Shi, Bin et al.; Numerical Simulation of an InP Photonic Integrated Cross-Connect for Deep Neural Networks on Chip; Applied Sciences, Jan. 9, 2020, pp. 1-15.
Shokraneh, Farhad et al; "The diamond mesh, a phase-error- and loss-tolerant fieldprogrammable MZI-based optical processor for optical neural networks" Opt. Express, vol. 28, No. 16; (2020); pp. 23495-23508.
Sun, Chen et al; "A 45 nm cmos-soi monolithic photonics platform with bit-statistics-based resonant microring thermal tuning"; IEEE Journal of Solid-State Circuits, vol. 51, No. 4; (2016); 20 pages.
Tait, Alexander et al; "Broadcast and Weight: An Intergated Network for Scalable Photonic Spike Processing"; Journal of Lightwave Technology, vol. 32, No. 21; (2014); pp. 4029-4041.
Yang, Lin et al; "On-chip CMOS-compatible optical signal processor"; Opt. Express, vol. 20, No. 12; (2012) pp. 13560-13565.
Zhuang, L. et al; Programmable photonic signal processor chip for radiofrequency applications; Optica 2; 854-859; (2015); 10 pages.
PCT/US2021/044956, Nov. 19, 2021, ISR.
PCT/US2021/073003, Mar. 22, 2022, ISR.
PCT/US2022/073039, Sep. 1, 2022, Invitation to Pay Additional Fees.
PCT/US2022/073039, Dec. 2, 2022, International Search Report and Written Opinion.
U.S. Appl. No. 63/392,475, filed Jul. 26, 2022, Aggarwal et al.
U.S. Appl. No. 18/076,196, filed Dec. 6, 2022, Aggarwal et al.
U.S. Appl. No. 18/076,210, filed Dec. 6, 2022, Aggarwal et al.
U.S. Appl. No. 18/217,898, filed Jul. 3, 2023, Aggarwal et al.
U.S. Appl. No. 63/437,639, filed Jan. 6, 2023, Plunkett et al.
U.S. Appl. No. 63/437,641, filed Jan. 6, 2023, Plunkett et al.
Liu, Jifeng, et al; "Waveguide-integrated, ultralow-energy GeSi electro-absorption modulators", Nature Photonics, [Online] vol. 2, No. 7, May 30, 2008 (May 30, 2008), pp. 433-437.
Wu, Longsheng et al.; "Design of a broadband Ge 1-20 1-x Six electro-absorption modulator based on the Franz-Keldysh effect with thermal tuning", Optics Express, [Online] vol. 28, No. 5, Feb. 27, 2020 (Feb. 27, 2020), p. 7585.
Zhang, Yulong; "Building blocks of a silicon photonic integrated wavelength division multiplexing transmitter for detector instrumentation" , Doktors Der Ingenieurwissenschaften (Dr.-Ing. ), Dec. 15, 2020 (Dec. 15, 2020), 128 pages.
U.S. Appl. No. 18/540,579, filed May 1, 2024, Office Action.
U.S. Appl. No. 17/807,692, filed Jul. 12, 2024, Office Action.
U.S. Appl. No. 18/407,408, filed Jul. 30, 2024, Notice of Allowance.
U.S. Appl. No. 18/407,410, filed May 24, 2024, Office Action.
U.S. Appl. No. 18/407,410, filed Aug. 12, 2024, Notice of Allowance.
U.S. Appl. No. 18/590,708, filed Aug. 7, 2024, Notice of Allowance.
PCT/US2023/015680, Aug. 9, 2024, International Preliminary Report on Patentability.
10-2023-7007856, Aug. 21, 2024, Foreign Notice of Allowance.
202180068303.5, Jul. 31, 2024, Foreign Notice of Allowance.
11202307570T, Apr. 10, 2024, Foreign Notice of Allowance.
202280020819.7, Apr. 4, 2024, Foreign Office Action.
202180093875.9, Apr. 12, 2024, Foreign Office Action.
PCT/US2024/010774, May 3, 2024, International Search Report and Written Opinion.
EP23220883, May 7, 2024, Extended European Search Report.
PCT/US2024/013168, May 8, 2024, International Search Report and Written Opinion.
22826043.6, Jun. 14, 2024, Extended European Search Report.
21853044.2, Jul. 23, 2024, Extended European Search Report.
1020237024129, Aug. 2, 2024, Foreign Office Action.
1020237044346, Aug. 27, 2024, Foreign Office Action.
U.S. Appl. No. 18/540,579, filed Oct. 8, 2024, Office Action.
U.S. Appl. No. 18/407,408, filed Oct. 2, 2024, Notice of Allowance.
U.S. Appl. No. 18/590,708, filed Oct. 1, 2024, Office Action.
U.S. Appl. No. 17/807,699, filed Oct. 1, 2024, Office Action.
U.S. Appl. No. 18/423,210, filed Sep. 30, 2024, Notice of Allowance.
202280020819.7, Sep. 16, 2024, Foreign Notice of Allowance.
2023-537068, Oct. 1, 2024, Foreign Office Action.
11202304676X, Oct. 4, 2024, Foreign Notice of Allowance.
Dakkak, A.D. et al."Accelerating Reduction and Scan Using Tensor Core Units, 2019,ACM,pp. 46-57.".
U.S. Appl. No. 18/407,410, Oct. 22, 2024, Notice of Allowance.
U.S. Appl. No. 18/590,689, Nov. 7, 2024, Office Action.
2023-508467, Nov. 12, 2024, Foreign Office Action.
11202300860T, Nov. 20, 2024, Foreign Office Action.

\* cited by examiner

PHOTONIC MEMORY FABRIC FOR SYSTEM MEMORY INTERCONNECTION

CROSS-REFERENCE TO RELATED APPLICATIONS

The present application claims priority to and incorporates by reference U.S. Provisional Patent Application Ser. No. 63/321,453, entitled PHOTONIC MEMORY FABRIC FOR MEMORY INTERCONNECTION, filed on Mar. 18, 2022. The present application incorporates by reference, in its entirety, U.S. patent application Ser. No. 17/807,694, entitled MULTI-CHIP ELECTRO-PHOTONIC NETWORK, filed on Jun. 17, 2022.

BACKGROUND

Current electronic processing systems are increasingly constrained by memory latency and bandwidth. As silicon processing node sizes have decreased, the speed and energy consumption of computation have improved while the interconnection to memory has not kept pace. Where improvements in memory bandwidth and latency have been achieved, it has been at the cost of imposing significant constraints on signal integrity and complexity of packaging. State-of-the-art high bandwidth memory (HBM) dynamic random-access memory (DRAM) requires the memory to be mounted on a silicon interposer to be placed within a few millimeters of the client device that uses the memory, with pins that run over electrical wires at over 3 GHz, imposing signal-integrity as well as thermal constraints that are both complex and expensive to meet. Moreover, the need to place the memory elements close to the chips that use them highly constrains the number and arrangement of HBM stacks around the client device and places significant restrictions on the total amount of memory that can be integrated into such a conventional system.

SUMMARY

One embodiment is an apparatus coupled to a memory. The apparatus comprises an interface associated with the memory, the interface having a first transmit unit for sending data from the memory and a first receive unit for receiving data sent to the memory, a fabric connected to the first transmit and receive units, the fabric including a plurality of routers, each of the routers having additional transmit and receive units, the routers arranged in a grid formed by connecting the additional transmit units with the additional receive units via optical links, and a first mesh coupled to a first portion of the memory, the first mesh including a first portion of the routers that create a first connection between the first transmit and receive units and a local electrical router associated with a first one of the routers.

Another embodiment is a system. The system comprises an interface system associated with the memory subsystem, the interface system having a first transmit unit for sending data from the memory subsystem and a first receive unit for receiving data sent to the memory subsystem, a fabric system connected to the first transmit and receive units, the fabric including a plurality of routers, each of the routers having additional transmit and receive units, the routers arranged in a grid formed by connecting the additional transmit units with the additional receive units via optical links, and a first mesh system coupled to a first portion of the memory subsystem, the first mesh system including a first portion of the routers that create a first connection between the first transmit and receive units and a local electrical router associated with a first one of the routers.

Yet another embodiment is a method. The method comprises generating a request for a data item in a memory, obtaining the data item from the memory with a photonic interface, sending the data item to a fabric using a transmit unit of the photonic interface, and routing the data item through a portion of the fabric coupled to the memory, the portion of the fabric including one or more additional transmit and receive units between the photonic interface and a destination receive unit.

DETAILED DESCRIPTION

Figure 1:
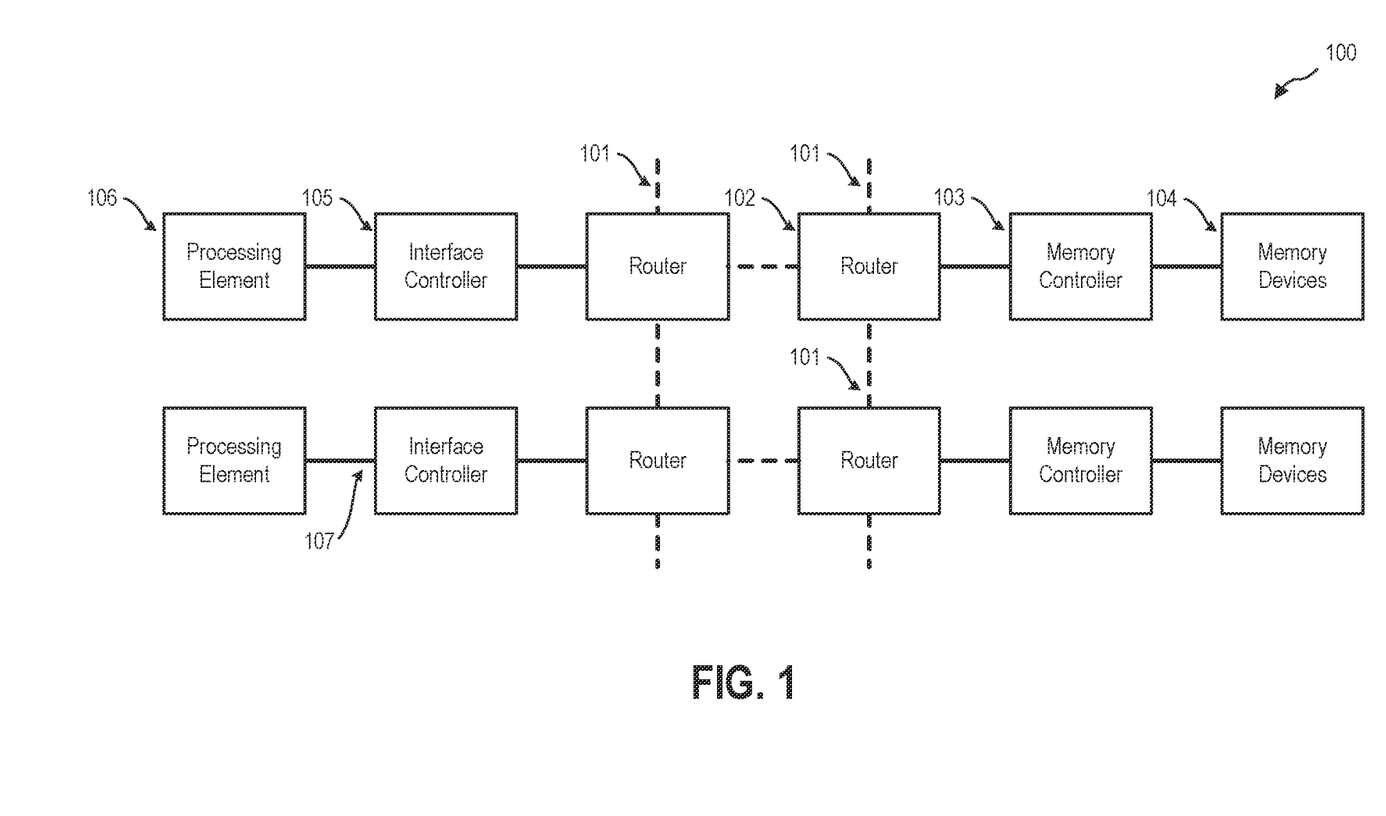
FIG. 1 is a diagram of a photonic memory fabric for system memory interconnection according to one embodiment.

The present application discloses an innovative memory fabric. At least one embodiment of an apparatus, system, or method described herein addresses the location, signal-integrity, and bandwidth constraints of current memory system architectures. As shown in FIG. 1, a memory fabric (100) in accordance with some embodiments includes four main components: a set of one or more photonic channels (101), optionally one or more message routers (102) that enable composition of links into a fabric, one or more memory controllers (103) to connect standard memory devices (104), and one or more interface controllers (105) to connect to processing elements (106). Connections between the routers (102) are made using photonic links (e.g., optical links), whereas the other connections in FIG. 1 may use alternatively electrical buses (107) or photonic links. In certain embodiments, e.g., as described below with reference to FIG. 9, the interface controllers (105) of the processing elements (106) connect electrically to the routers (102), whereas one or more memory controllers (103) are augmented by photonic interface controllers that connect optically to the routers (102) and/or directly to processing elements (106). Many topologies are possible that use one or more photonic links and zero or more routers; examples are described further below.

Figure 2:
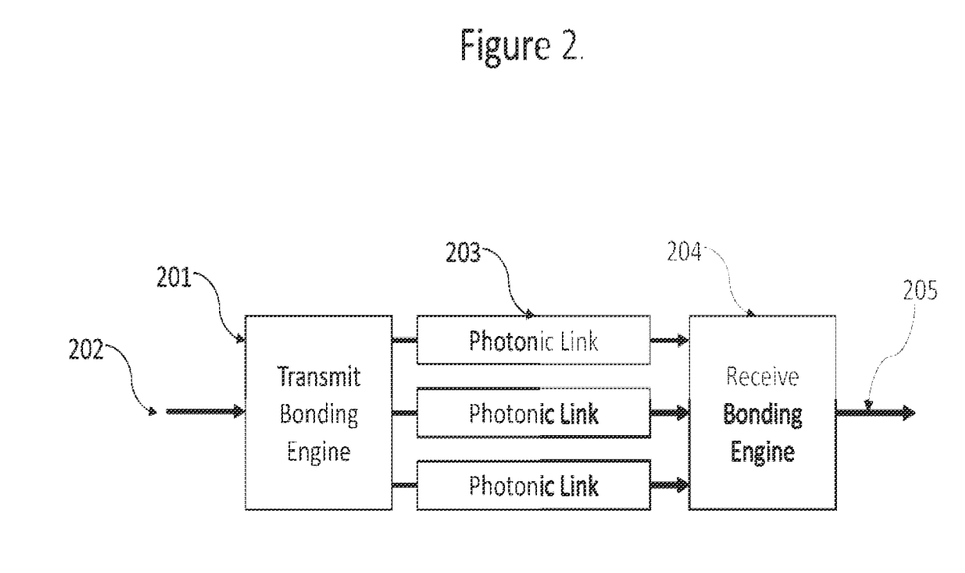
FIG. 2 is a diagram of one embodiment of a photonic channel for use in a memory fabric for system memory interconnection.
Figure 3:
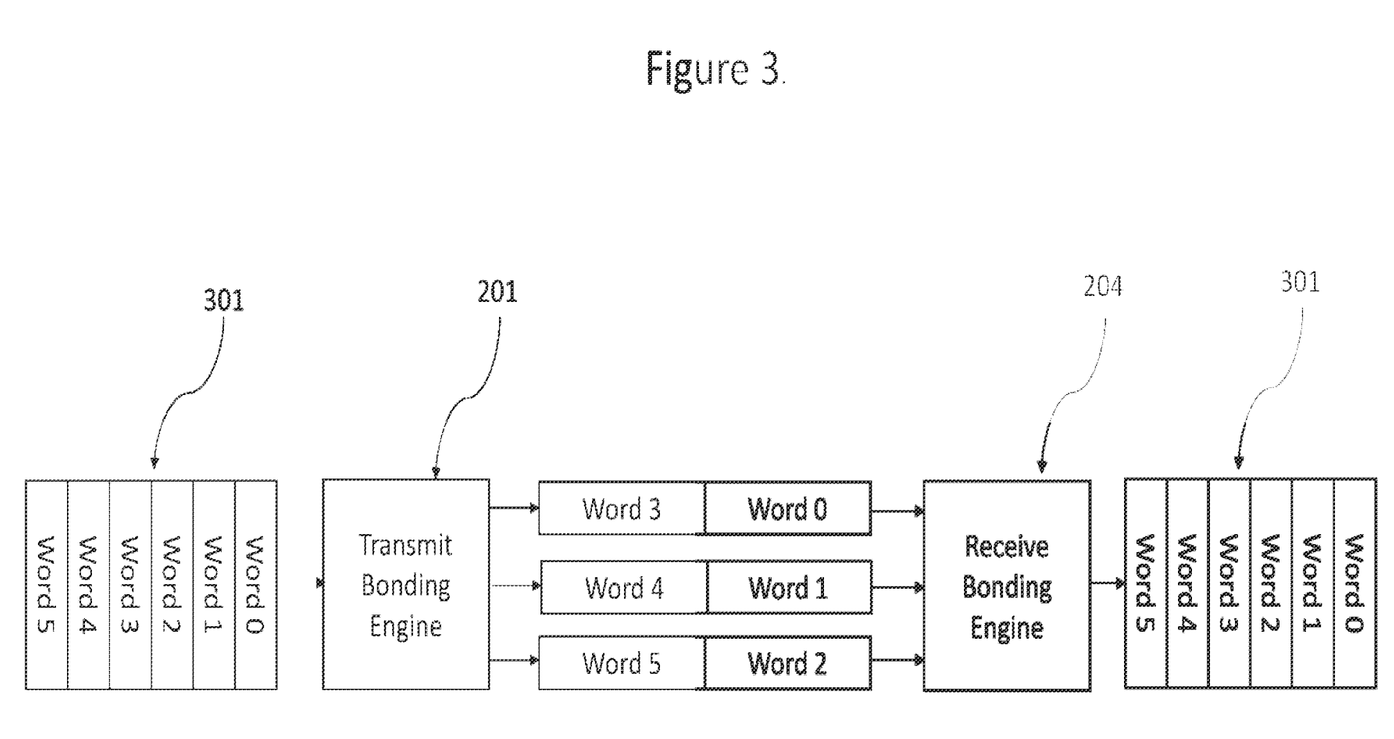
FIG. 3 is a diagram of another embodiment of a photonic channel for use in a memory fabric for system memory interconnection.

A photonic channel contains two unidirectional sets of (one or more) links capable of making a bi-directional channel for transferring a message in the form of a variably sized packet. As shown in FIGS. 2 and 3, multiple unidirectional links in one direction may be bonded together to form a single logical channel that can transfer messages. In this embodiment, a message (202) consisting of a sequence of, e.g., 256-bit words (301) is presented to the transmit bonding engine (201). The transmit bonding engine (201) may split the words (301) evenly across the active photonic links (203). In the depicted example, data (e.g., a data item) arrives at the receive bonding engine (204) on three links. Sequence information added to the words (301) by the transmit bonding engine (201) permits the original message (202) to be assembled in order and sent on the output interface (205) of the receive bonding engine (204). Bonding allows high-bandwidth, low-latency channels to be constructed from several lower-bandwidth links and provides the ability to configure out non-working links.

Figure 4:
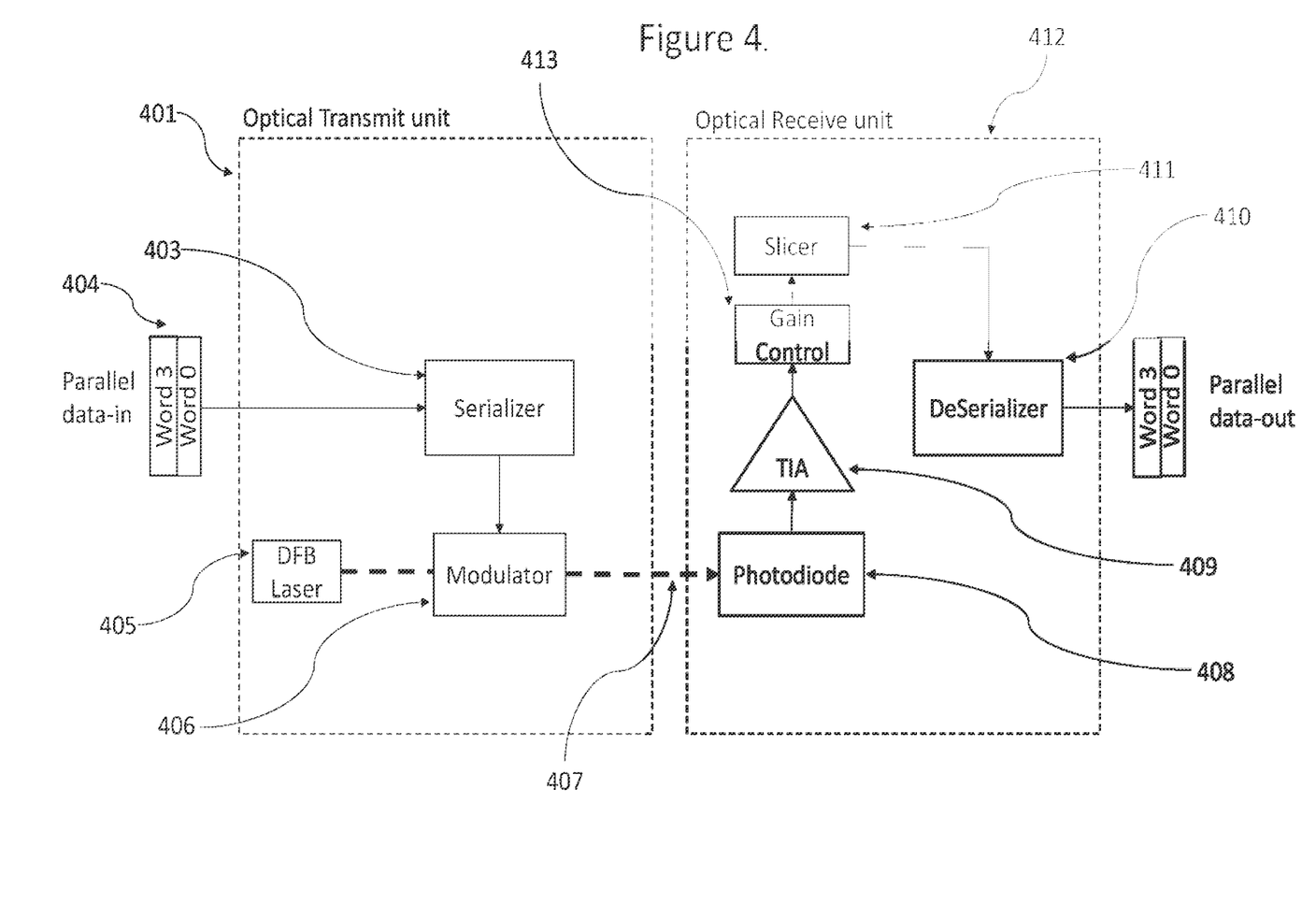
FIG. 4 is a diagram of an embodiment of a transmitter and a receiver that can be used in a memory fabric for system memory interconnection.

As shown in FIG. 4, each link (e.g., 203) in a photonic channel includes an optical transmit unit (401), an optical receive unit (412), and an optical transmission medium (407) (e.g., an optical waveguide or fiber) connecting the transmit unit (401) to the receive unit (412). The transmit unit (401) includes an optical modulator (406) that imparts a message onto an optical signal by modulating carrier light output by a light source (405), and an electrical serializer (403) that converts an electronic message received in the form of parallel data words (404) into a signal suitable for driving the optical modulator (406). The optical modulator (406) may include an electro-absorption modulator (EAM), a micro-ring resonator, a ring modulator, a Mach-Zender interferometer (MZI), and a quantum confined stark effect (QCSE) electro-absorptive modulator. The optical modulator (406) may be coupled to a driver. In some embodiments, the driver is a photonic-integrated circuit (PIC) or a electronic-integrated circuit (EIC) (e.g., as described in connection with U.S. patent application Ser. No. 17/807,694, entitled MULTI-CHIP ELECTRO-PHOTONIC NETWORK, filed on Jun. 17, 2022, which is hereby incorporated by reference in its entirety). The transmit unit (401) sends data (e.g., from one or more memory devices (104)) to the receive unit (412). The receive unit (412) includes a photodiode (408) to convert the optical signal received via the transmission medium (407) back to an electrical signal, and associated electronics including a transimpedance amplifier (409) and gain control to normalize the signal level (413), a slicer (411) to extract the bit-stream, and a de-serializer (410) to convert the received message back into parallel data. The optical modulator (406) and the electrical serializer (403) are coupled together by an electrical connection such as a copper pillar or C4 bump. Likewise, the photodiode (408) and the transimpedance amplifier (409) are also coupled together via an electrical connection like a copper pillar or C4 bump.

The optical transmission medium (407) may include a waveguide on a photonic-integrated circuit (PIC), an optical fiber or other optical transmission medium (such as free space optics or glass-etched waveguide), or some combination of the foregoing. Examples of optical modulators (406) include, but are not limited to, electro-absorption modulators (EAMs) and micro-ring resonators. The light source (405), which is conceptually part of the transmit unit (401), may be shared between transmit units of multiple photonic links.

The light source(s) (405) feeding the modulators (406) may be located locally on the PIC or connect to the PIC via optical fiber. When integrated onto the PIC, distributed fiber Bragg (DFB) lasers or quantum dot lasers can be attached during processing or integrated in the native technology where possible. When remote, any packaged continuous wave (CW) laser suitable in power and spectrum for the modulation technology may be used. In one embodiment, the light source is a set of DFB lasers attached to a silicon interposer and connected to the PIC via optical fibers. In one embodiment, the link is modulated at 56 Gb/s in a non-return-to-zero (NRZ) code, but more spectrally efficient modulation schemes, such as PAM-4 or PAM-8 or higher-order pulse amplitude modulation, may be used to allow higher-bandwidth and lower-latency links.

Figure 5:
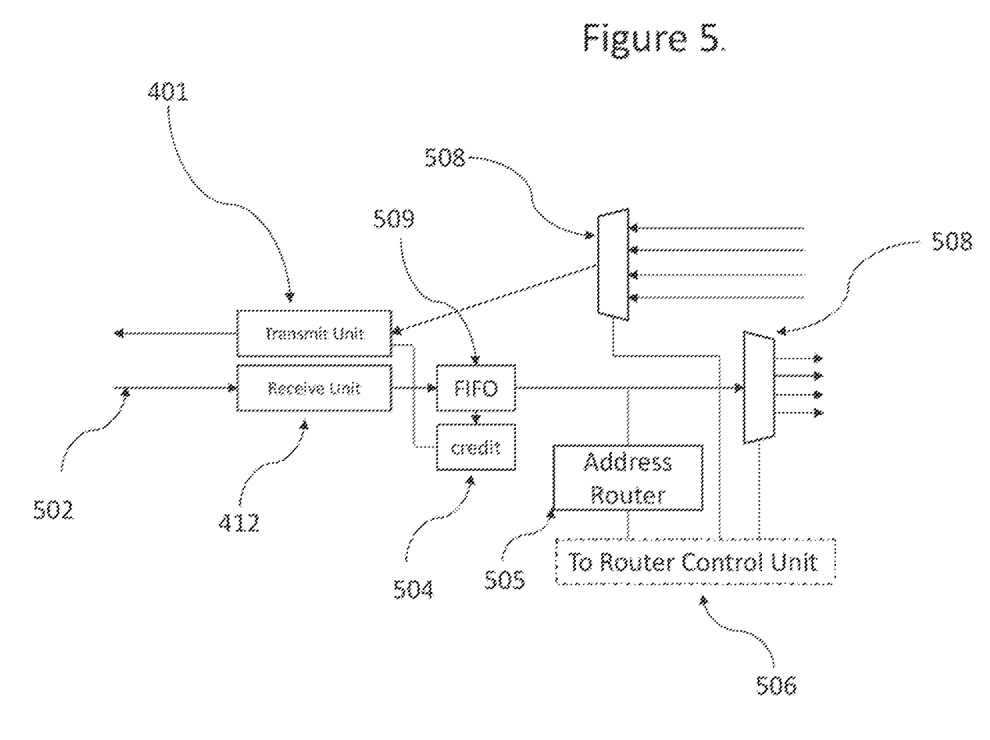
FIG. 5 is a diagram of an embodiment of a message router that can be used in a memory fabric for system memory interconnection.

A photonic channel can be used to directly connect a memory subsystem in a point-to-point fashion, providing dedicated bandwidth between the memory subsystem and a processing element. However, in some embodiments, more complex topologies are created by introducing a routing element that dynamically routes messages between the photonic channels. When a router is used, a portion of the message (e.g., a data item, a first data item, a second data item) having routing information can include the address of the destination photonic-fabric channel, an identifier associated with a compute or a memory mesh, or the like. As shown in FIG. 5, a message arriving at the router is processed by an address router (505) unit that extracts the destination address while the arriving message is stored in a FIFO (first in-first out) buffer (509). A routing algorithm (e.g., a routing module) uses the address bits to select an egress port selected by an output multiplexor (508) based on the fabric topology and routing policy. Coordination of the port units depicted in FIG. 5 are controlled by a router control unit (506) that connects to the data input/output multiplexors (508) and the address router (505) in each port. The router control unit (506) resolves port contention when traffic arrives for the same egress port. In some embodiments, the routing algorithm moves data (e.g., a data item, a first data item, a second data item) between two areas of memory that are each separately linked to a mesh (e.g., a first mesh and a second mesh).

Figure 6:
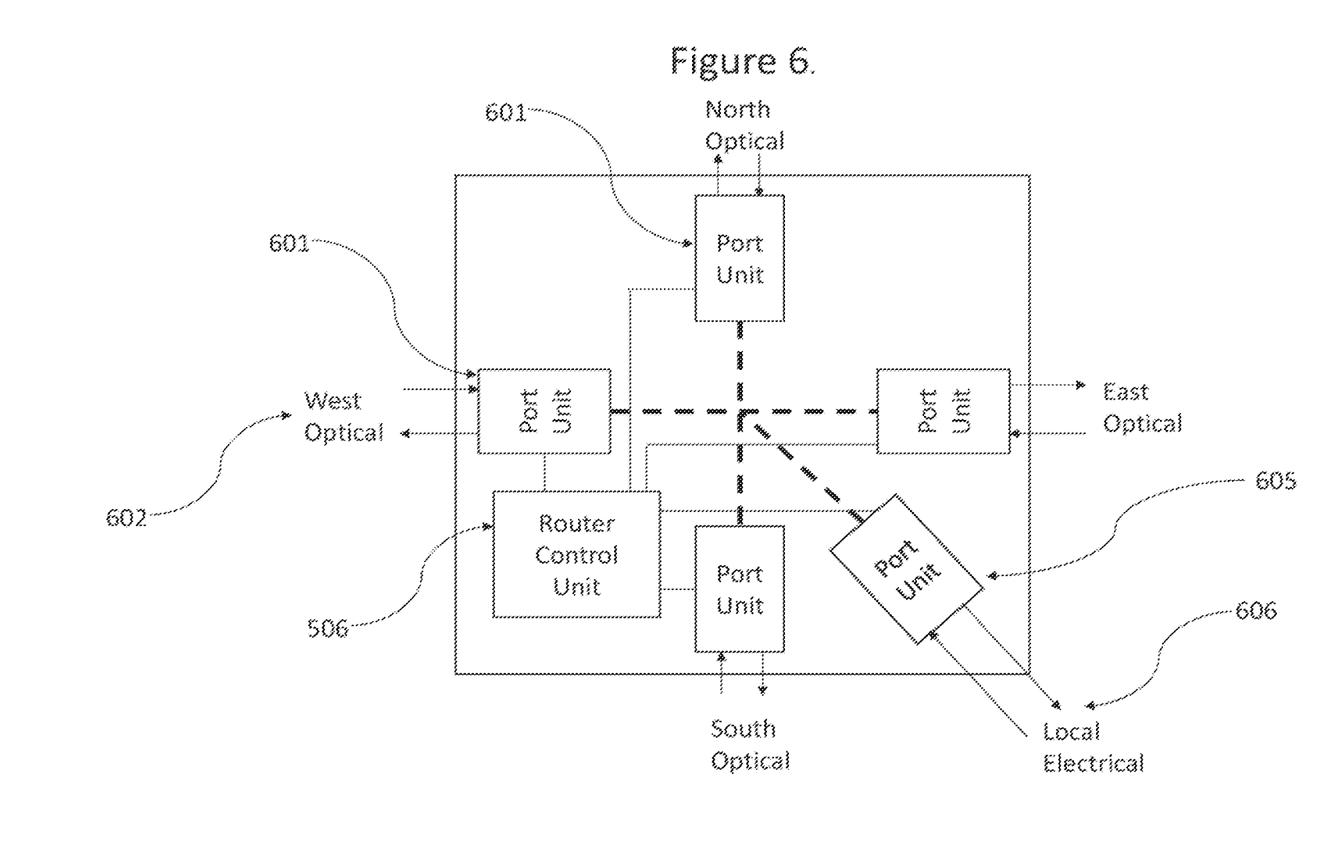
FIG. 6 is a diagram showing an example of the ports that can be used in a router in a memory fabric for system memory interconnection.

Many topologies and routing algorithms are possible for the fabric or a portion of the fabric, such as hyper-cube or mesh. In various embodiments, the topology is a mesh or wrapped mesh. In such a system, each router has four optical ports and one electronic port. As shown in FIG. 6, the four optical ports (601) are connected to the north, south, east, or west routers in the fabric. The port unit multiplexors (508) are connected electrically within the router to provide full connectivity between the port units. The router control unit (506) takes request from the various port units and grants access to an egress port in such a fashion that contentions are resolved. Port units may have optical interfaces (602) or electronic interfaces (606) (e.g., a local electrical router) based on their destination. The local port (605) to resources connected to the router will typically be electrical while the connections between routers are usually photonic. In such a system, a convenient addressing scheme encodes the number of steps left in the north/south or east/west direction. A positive number encodes a move north or east, a negative number south or west. As a message traverses a set of routers, if the message moves north, the north/south portion of the address is decremented; likewise, if the message moves south, the north/south portion of the address is incremented. Equivalently, if the message moves east, the east/west portion of the address is decremented, and if the message moves west, it is incremented. The message address is initialized with the number of steps in each direction required to reach the destination. When both the north/south and east/west fields are zero, the message has arrived at the destination and is delivered to the electrical port.

At the electronic port of each router or at the end of a photonic link in point-to-point architectures, a controller converts messages into a bus protocol that can ultimately be used to access the connected memory. Two examples of such protocols are Peripheral Component Interconnect Express (PCIe) and Advanced Extensible Interface (AX). In one embodiment, AXI transactions are forwarded over the memory fabric. The messages router uses the top 10 bits of the AX address to specify the fabric destination and a further 32 bits to specify memory access information, such as an offset (e.g., memory access information) in the target memory controller. To prevent the ingress FIFOs of the router from overflowing, a flow control scheme should be implemented to control the number of messages in flight in the fabric. This is accomplished by a credit flow control mechanism. A port is initialized with a number of tokens representing memory transactions that are smaller in number than the FIFO at the other end of the link. Every time a new transaction is sent on a link, a credit register (504) on the egress port is examined. Each memory transaction is a certain number of credits in size. If there are more than memory transaction size credits in the egress port credit register, then transmission can proceed, and the number of tokens is reduced by memory transaction size credits. If there are insufficient credits, the transmission is stalled. When a receiver process removes a message from the ingress FIFO, a credit message with memory transaction size credits is sent back on the link. Upon receiving the credit, the egress credit register is incremented, and if sufficient credits are now available to transmit any stalled messages, the transmission process can be restarted. Dynamic routing decisions are made when alternate valid routes are available. In such a case, the path with most credits is selected, which provides load balancing within the fabric.

The photonic links and photonic fabric described above can be employed to provide photonic connection to generally any memory subsystem augmented with a suitable photonic interface controller. As herein understood, a memory subsystem includes a set of one or more memory devices and a memory controller coupled to the set of memory devices to provide access to data stored thereon. The photonic interface controller connects the memory controller to the photonic interface (e.g., interface system) associated with a photonic channel, such as with the optical modulator and photodetector of a bidirectional channel. The memory controller and photonic interface controller may be implemented in separated die that interface with each other, or alternatively in a single die. In some embodiments, the memory subsystem is a memory stack device that includes a stack of DRAM die.

Figure 7:
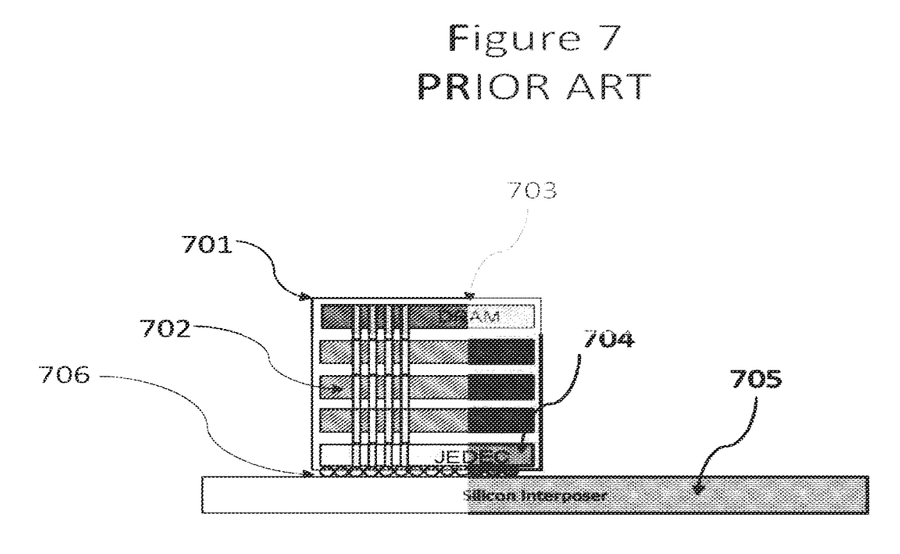
FIG. 7 is a diagram of a conventional HBM subsystem.

Photonic memory connections as described are especially useful to implement complex, scalable HBM (701) systems. In a conventional HBM subsystem, as shown in FIG. 7, a stack of DRAM (703) die is connected using through-silicon via (TSV) technology (702). At the base of the stack, a DRAM controller presents a Joint Electron Device Engineering Council (JEDEC) (704) compliant interface out of the bottom the stack that connects to the system via a silicon interposer (705) using bump attach (706) and a DRAM control interface up into the DRAM stack above to access the memory itself and perform bookkeeping tasks such as memory refresh.

Figure 8:
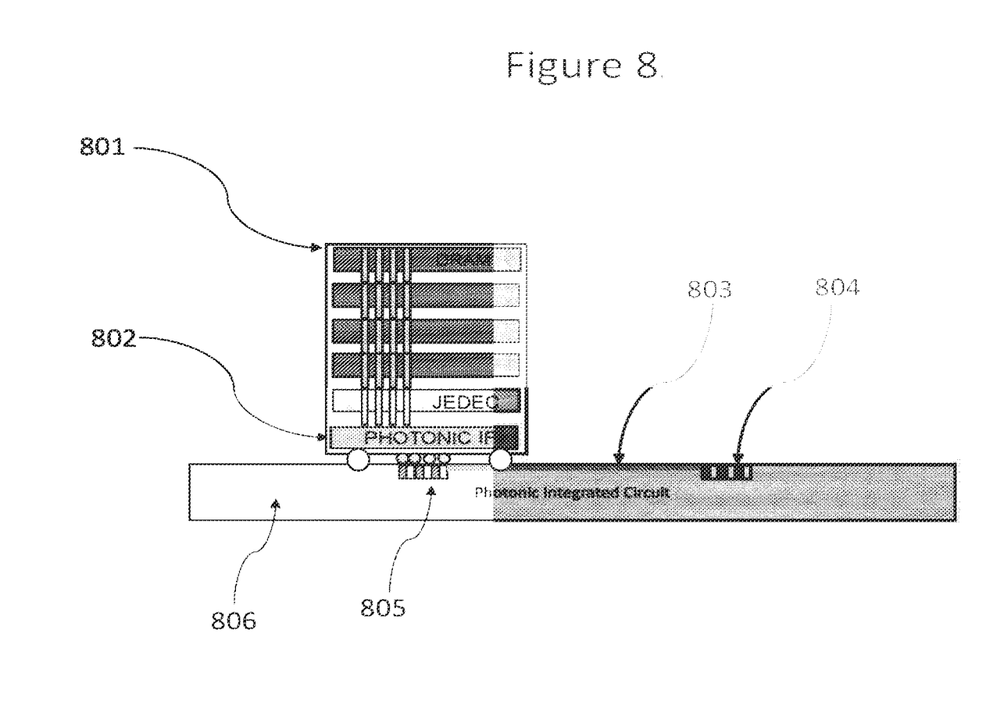
FIG. 8 is a diagram of an HBM subsystem according to one embodiment.

In an example implementation of photonically connected memory in accordance with an embodiment, illustrated in FIG. 8, an additional controller layer (802) is added to the base of the HBM stack (801). This additional controller layer (802) serves as a photonic interface controller that connects the (standard) DRAM controller to the optical modulator and photodetector of a bidirectional channel. Thus, addition of this controller layer (802) converts the standard HBM JEDEC interface into a photonic-fabric interface that in turn connects to the modulators and photodiodes (805) in the photonic-integrated circuit (806). This arrangement enables the use of standard HBM modules connected over long distances, using waveguides (803), optical fibers, or some other optical transmission media that finally terminate in another fabric interface elsewhere in the system (804). In an alternative embodiment, the DRAM controller and the photonic interface controller are integrated into a single layer (or single functional unit) at the base of the HBM stack for further optimization.

Figure 9:
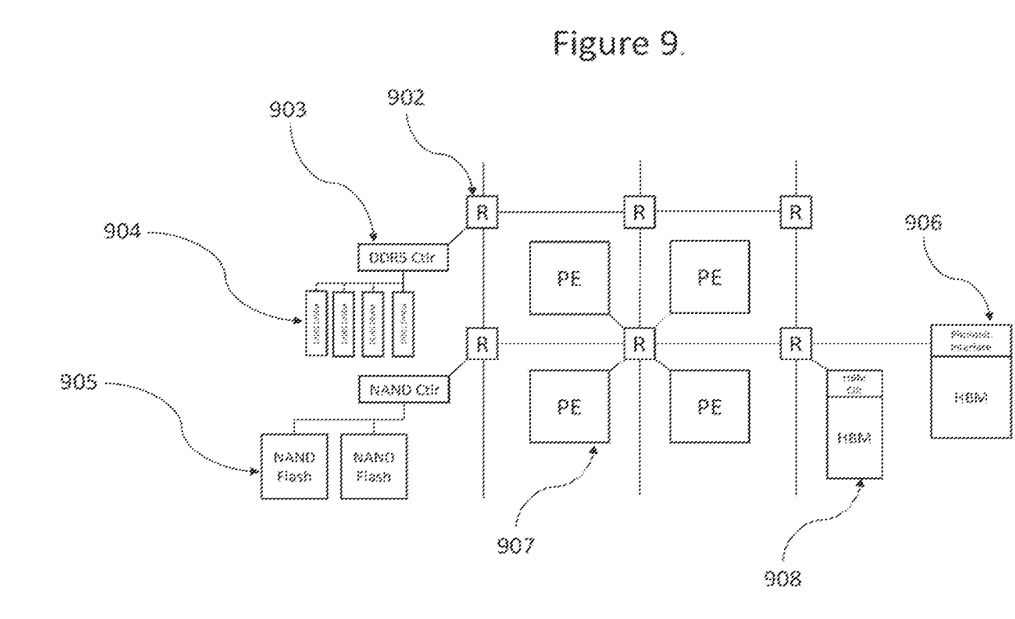
FIG. 9 is a diagram of a photonic memory fabric connected to a variety of memory types according to one embodiment.

The memory fabric architecture is agnostic to the type of connected memory. As shown in FIG. 9, different memory controllers allow connecting different types of memory to the photonic memory fabric. In the depicted embodiment, the core of the system is an arrangement of processing elements (907) that are electrically connected to photonic routers (902), which are in turn connected in a sub-fabric or mesh. Memory controllers can then be connected to either the electrical ports of the routers (as shown for memory controller (903)) or, when augmented by or integrated with a photonic interface controller (906), via a photonic channel to a photonic port of the router. Non-limiting examples of memory types for which it is desirable to provide connectivity are NAND Flash memory (905) (including but not limited to solid-state drive (SSD) memory), NOR Flash memory (including conventional CMOS memory and thin film transistor-based memory), phase change memory (PCM), storage class memory (SCM) such as Optane, magneto-resistive memory (MRAM), resistive RAM (ReRAM or RRAM), and traditional DRAM (including HBM (908) and DDR-based DRAM (904). An HBM equipped with a photonic interface controller (906) layer that includes a routing element provides a scalable photonically connected memory that can be stacked like DIMM memory. A selection of memory controllers with different interfaces permits the construction of both heterogenous and homogenous memory systems (e.g., a combination of multiple types of the memories described above).

An important aspect of the memory fabric is to enable the construction of complex topologies of memories that best serve the application requirements. While this discussion of topologies focuses on HBM, it is equally applicable to other types of memory. In the simplest arrangement, a set of point-to-point channels connect an HBM stack to one or more fabric interfaces located in the same or several chips. The benefit of this arrangement is two-fold. First, the system designer is relieved of the distance constraints of the HBM JEDEC interface, and the HBM memory can be placed arbitrarily far from the client chip if it is within the optical budget of the photonic links (typically several meters). This permits higher-density memory systems than can currently be constructed using electrical interfaces. Furthermore, there can be significant energy savings when the photonic fabric interface is located at the center of a large die, where photonic transport of the data is more efficient than an equivalent high-bandwidth electrical interconnect in the client chip itself. The second benefit derives from being able to control the power density of the system by spacing the memory and client chips (e.g., implementing processing elements) to optimize cooling efficiency, as the distances are no longer dictated by the electrical interfaces. More complex topologies can be composed by integrating routers in both memory and client-chip components. The use of photonic memory fabrics permits arbitrary grouping of memory and client chips that best serve the bandwidth and connectivity needs of applications. Groups of memory can surround a client chip on a single interposer, and several chips and memory can be integrated onto a single interposer. Special-purpose memory and compute subsystems on separate interposers can be networked together using any of the optical transport mediums outlined above, and using a mixture of fabric topologies that may vary from a single or set of point-to-point links aggregated on ribbon fibers to mesh and hyper-cube topologies providing significantly richer and higher bandwidth topologies that utilize various collections of waveguides and optical fibers to connect the components.

Figure 10:
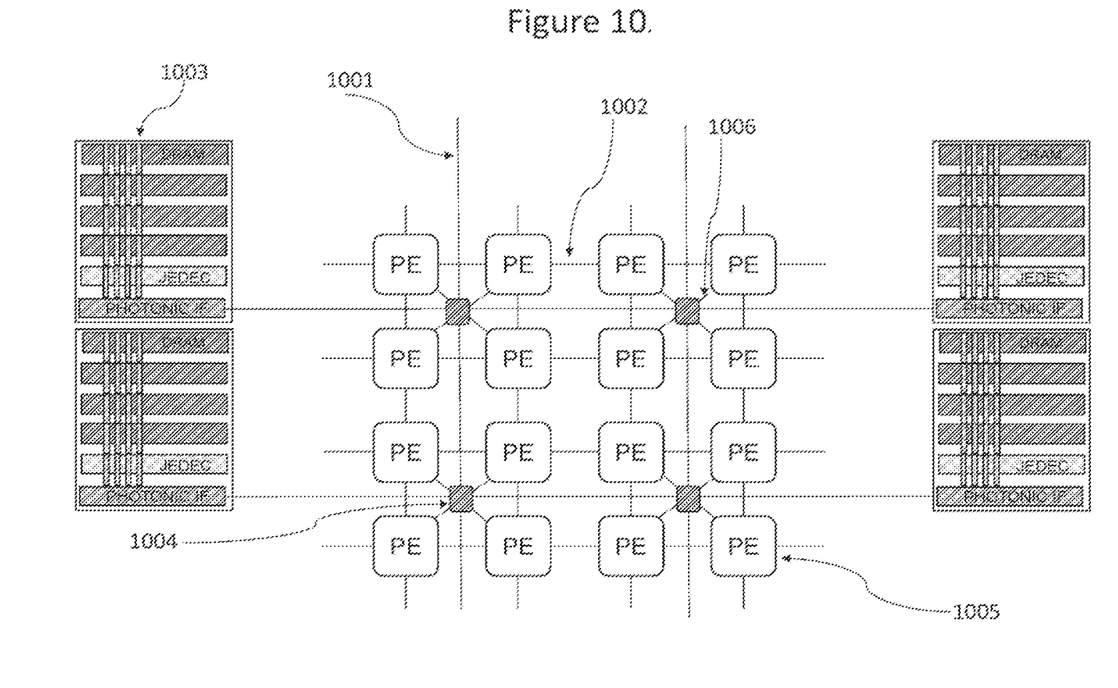
FIG. 10 is a diagram of a photonic memory fabric for system memory interconnection according to one embodiment.

The disclosed memory fabric may be used to augment the processing system described in the U.S. patent application entitled "MULTI-CHIP ELECTRO-PHOTONIC NETWORK", which has been incorporated by reference herein. Memory and compute traffic over a photonic fabric have different characteristics: compute traffic usually involves short hops between adject processing elements, while memory traffic often travels long distances from memory arrays located away from the processor but requires very high bandwidth to support HBM memory. As shown in FIG. 10, in one beneficial implementation, a balance can be achieved by overlaying two mesh networks—a memory mesh (1001) and a compute mesh (1002). The compute mesh (1002) is a densely connected nearest-neighbor mesh connecting all of the processing elements (1005) in the system. The memory mesh (1001) is a lower-density mesh with wider channels that feeds groups of compute elements from router nodes (1004) placed equidistant from a cluster of processing elements (1005) and connects (1006) directly to memory subsystems (1003). The architectural split of memory and compute networks allows each to be optimized for the magnitude of data, traffic patterns, and bandwidth of each fabric application.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus coupled to a memory, comprising:
   an interface associated with the memory, the interface having a first transmit unit for sending data from the memory and a first receive unit for receiving data sent to the memory; and
   a fabric connected to the first transmit unit and the first receive unit, the fabric including a plurality of routers, each of the plurality of routers having additional transmit units and additional receive units, the plurality of routers arranged in a grid formed by connecting the additional transmit units with the additional receive units via optical links,
   wherein a first portion of the plurality of routers creates a first connection between the first transmit unit and the first receive unit and a local electrical router associated with a first one of the plurality of routers, and wherein the first portion of the plurality of routers are connected to a first portion of the memory,
   wherein the interface includes a second transmit unit and a second receive unit connected to the fabric, and
   wherein a second portion of the plurality of routers creates a second connection between the second transmit unit and the second receive unit and the local electrical router, and wherein the second portion of the plurality of routers are connected to a second portion of the memory.

2. The apparatus of claim 1, wherein the first transmit unit and the additional transmit units include a driver coupled to an optical modulator.

3. The apparatus of claim 1, wherein the first receive unit and the additional receive units include a photodetector coupled to an amplifier.

4. The apparatus of claim 1, further comprising a routing module for transporting a first data item in the first portion of the memory to the local electrical router.

5. The apparatus of claim 4, wherein the routing module transports a second data item in the second portion of the memory to the local electrical router.

6. The apparatus of claim 2, wherein the driver is coupled to the optical modulator with a copper pillar or a C4 bump.

7. The apparatus of claim 3, wherein the photodetector is coupled to the amplifier with a copper pillar or a C4 bump.

8. The apparatus of claim 2, wherein the driver resides in an electronic-integrated circuit (EIC) or a photonic-integrated circuit (PIC) and the optical modulator and optical links reside in the PIC.

9. The apparatus of claim 3, wherein the amplifier resides in an electronic-integrated circuit (EIC) or a photonic-integrated circuit (PIC) and the photodetector resides in the PIC.

10. The apparatus of claim 1, wherein the interface further includes a memory controller, wherein when a request includes memory access information, the memory controller uses the memory access information to obtain a data item from the memory.

11. The apparatus of claim 1, wherein the memory is selected from the group consisting of a NAND Flash memory, a solid-state drive (SSD) memory, a NOR Flash memory, a CMOS memory, a thin film transistor-based memory, a phase change memory (PCM), a storage class memory (SCM), a magneto-resistive memory (MRAM), a resistive RAM, a DRAM, an HBM, a DDR-based DRAM, and a DIMM memory.

12. The apparatus of claim 2, wherein the optical modulator is selected from the group consisting of an electro-absorption modulator (EAM), a micro-ring resonator, a ring modulator, a Mach-Zender interferometer (MZI), and a quantum confined stark effect (QCSE) electro-absorptive modulator.

13. A system that is operably coupled to a memory subsystem comprising:
    an interface system associated with the memory subsystem, the interface system having a first transmit unit for sending data from the memory subsystem and a first receive unit for receiving data sent to the memory subsystem; and
    a fabric connected to the first transmit unit and the first receive unit, the fabric system including a plurality of routers, each of the plurality of routers having additional transmit units and additional receive units, the plurality of routers arranged in a grid formed by connecting the additional transmit units with the additional receive units via optical links, wherein a first portion of the plurality of routers creates a first connection between the first transmit unit and the first receive unit and a local electrical router associated with a first one of the plurality of routers, and wherein the first portion of the plurality of routers are connected to a first portion of the memory, wherein the interface system includes a second transmit unit and a second receive unit connected to the fabric, and wherein a second portion of the plurality of routes creates a second connection between the second transmit unit and the second receive unit and the local electrical router, and wherein the second portion of the plurality of routers are connected to a second portion of the memory.

14. The system of claim 13, wherein the first transmit units and the additional transmit units include a driver coupled to an optical modulator.

15. The system of claim 13, wherein the first receive units and the additional receive units include a photodetector coupled to an amplifier.

16. The system of claim 13, further comprising a routing system for transporting a first data item in the first portion of the memory subsystem to the local electrical router.

17. The system of claim 16, wherein the routing system transports a second data item in the second portion of the memory subsystem to the local electrical router.

18. The system of claim 14, wherein the driver is coupled to the optical modulator with a copper pillar or a C4 bump.

19. The system of claim 15, wherein the photodetector is coupled to the amplifier with a copper pillar or a C4 bump.

20. The system of claim 14, wherein the driver resides in an electronic-integrated circuit (EIC) or a photonic-integrated circuit (PIC) and the optical modulator and the optical links reside in the PIC.

21. The system of claim 15, wherein the amplifier resides in an electronic-integrated circuit (EIC) or a photonic-integrated circuit (PIC) and the photodetector resides in the PIC.

22. The system of claim 13, wherein the interface system further includes a memory controller, wherein when a request includes memory access information, the memory controller system uses the memory access information to obtain a data item from the memory subsystem.

23. The system of claim 13, wherein the memory subsystem is selected from the group consisting of a NAND Flash memory, a solid-state drive (SSD) memory, a NOR Flash memory, a CMOS memory, a thin film transistor-based memory, a phase change memory (PCM), a storage class memory (SCM), a magneto-resistive memory (MRAM), a resistive RAM, a DRAM, an HBM, a DDR-based DRAM, and a DIMM memory.

24. The system of claim 14, wherein the optical modulator is selected from the group consisting of an electro-absorption modulator (EAM), a micro-ring resonator, a ring modulator, a Mach-Zender interferometer (MZI), and a quantum confined stark effect (QCSE) electro-absorptive modulator.

* * * * *